(12) United States Patent
Hoefer et al.

(10) Patent No.: US 6,552,900 B1
(45) Date of Patent: Apr. 22, 2003

(54) DEVICE FOR COOLING AN ELECTRIC MODULE AND A TECHNICAL APPLIANCE

(75) Inventors: Bruno Hoefer, Olching (DE); Guido Reeck, Ottobrunn (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/958,507

(22) PCT Filed: Apr. 10, 2000

(86) PCT No.: PCT/DE00/01077

§ 371 (c)(1),
(2), (4) Date: Oct. 9, 2001

(87) PCT Pub. No.: WO00/62591

PCT Pub. Date: Oct. 19, 2000

(30) Foreign Application Priority Data

Apr. 13, 1999  (DE) .......................................... 199 16 594

(51) Int. Cl.⁷ ................................................ H05K 7/20
(52) U.S. Cl. ...................... 361/695; 55/385.4; 55/385.7; 174/35 R; 174/35 MS; 361/818; 454/184; 428/45; 428/304.4
(58) Field of Search ............................ 55/385.4, 385.7, 55/471, 493, 508; 174/35 R, 35 GC, 35 MS; 361/687–695, 816, 818; 428/45, 304.4, 311.11, 293.4; 454/184

(56) References Cited

U.S. PATENT DOCUMENTS

| 4,408,255 | A | | 10/1983 | Adkins |
| 5,032,689 | A | * | 7/1991 | Halligan et al. .......... 174/35 R |
| 5,431,974 | A | | 7/1995 | Pierce |
| 5,886,296 | A | | 3/1999 | Ghorbani et al. |
| 6,171,357 | B1 | * | 1/2001 | Guttmann ................... 55/385.7 |
| 6,185,097 | B1 | * | 2/2001 | Benl .......................... 361/695 |
| 6,211,458 | B1 | * | 4/2001 | Mitchell et al. .......... 174/35 R |

FOREIGN PATENT DOCUMENTS

| DE | G 87 03 954.0 | 6/1987 |
| DE | 196 26 778 A1 | 1/1998 |
| DE | 197 55 944 A1 | 8/1999 |

* cited by examiner

Primary Examiner—Gregory Thompson
(74) Attorney, Agent, or Firm—Bell, Boyd & Lloyd, LLC

(57) ABSTRACT

An apparatus having at least one membrane filter for a superficial filtering of at least dirt particles from inflowing cooling air for cooling an electrical module and also at least one cooling device for establishing an air flow in the housing and for discharging the heated-up cooling air out of the housing from at least one air outlet, the membrane filter having a netting of an electrically conductive material for electromagnetically shielding the electrical module.

11 Claims, 4 Drawing Sheets

Front view

Front view

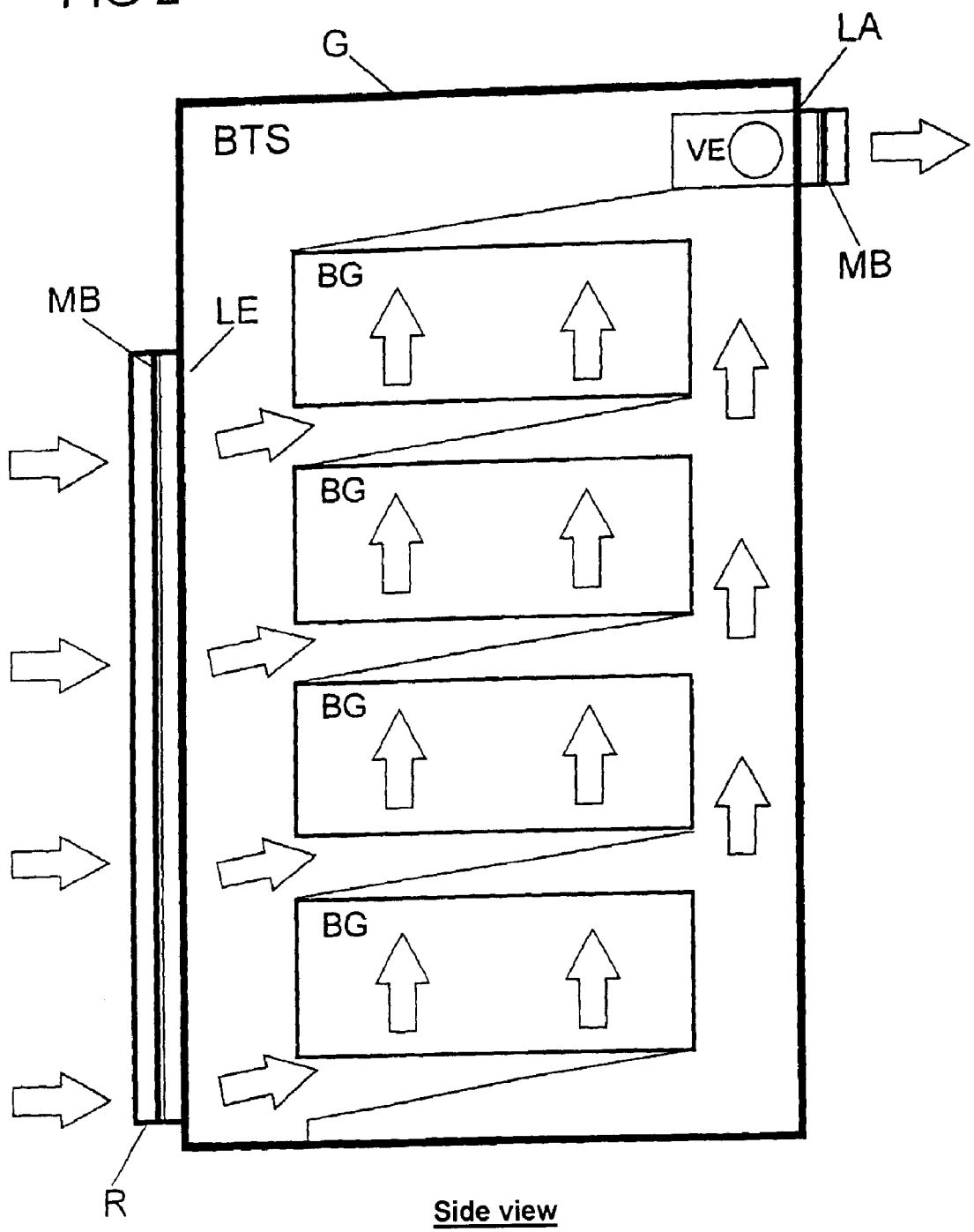

DEVICE FOR COOLING AN ELECTRIC MODULE AND A TECHNICAL APPLIANCE

BACKGROUND OF THE INVENTION

The present invention relates to an apparatus for cooling an electrical module arranged in a housing and, in particular, a base station of a mobile radio system or wireless subscriber line system.

In an electrically operated technical appliance, the lost power of components and modules through which current flows leads to a heating-up of the appliance. Since standard electrical components for technical appliances have only a limited admissible operating temperature range of, for example, up to 70° C., they are cooled by cooling devices. These cooling devices are, for example, fans which establish an air flow in the housing, flowing around or through the electrical components and modules, and which consequently bring about a discharge of the thermal output produced.

During operation of the technical appliances outside enclosed spaces or in adverse conditions within enclosed spaces, adequate protection from environmental influences, such as, for example, dirt particles and liquids, must be additionally provided along with heat discharge. In this respect, protective regulations in accordance with the specified IP classes must be observed in order to ensure longterm functioning of the technical appliances.

It is known from DE 19755944 to provide in an air inlet of a housing a membrane filter for a superficial filtering of dirt particles from inflowing cooling air and for separating out liquids. In comparison with a housing known, for example, from DE 19626778, with an air/air heat exchanger, which ensures complete separation of an internal cooling circuit from an external cooling circuit, adequate protection of the electrical components can be achieved for the aforementioned areas of use of the technical appliance with the corresponding protective regulations in a simple way by use of the membrane filter. At the same time, a temperature difference, required for the cooling, between the temperature of the ambient atmosphere and the temperature inside the housing is reduced.

A membrane filter of this type is based, for example, on a membrane filter known for use in articles of clothing by the designation Goretex, Sympatex, etc. The membrane of the filter includes a fine netting or knitted fabric of fibers, which permits a very small pore size. An example of a material which may be used for this is PTFE (polytetrafluoroethylene), also known by the name Teflon. The membrane is generally provided on a backing material, such as, for example, polyamide, in order to achieve a certain stability and resistance of the membrane filter.

In addition to the criteria with regard to protective regulations, EMC guidelines (EMC—Electromagnetic Compatibility) also must be satisfied, ensuring on the one hand protection of the electrical modules arranged in the housing of the technical appliance from electromagnetic influences from the surroundings of the appliance and, on the other hand, protection of the surroundings from electromagnetic radiation emanating from the electrical modules.

On account of the plastic material used, the membrane filter is permeable to electromagnetic radiation and consequently does not bring about adequate shielding. Additional shielding, for example by a wire netting arranged in front of the membrane filter, is therefore necessary to satisfy the EMC guidelines. However, it is disadvantageous to provide this additional wire netting as a further element of the housing of the technical appliance and, for example, it increases the overall dimensions of the housing. Furthermore, it makes maintenance and cleaning of the membrane filter more difficult.

U.S. Pat. No. 5,431,974 discloses a filter arrangement for electromagnetic shielding. The filter arrangement in this case includes an electrically conductive frame with at least one opening, a panel of porous electrically conductive material, a layer of electrically conductive adhesive and an electrically conductive gasket material. Preferably chosen as the porous panel is a synthetic polymer which has been made electrically conductive at the surface by electrochemical processes.

The present invention, therefore, is directed toward specifying an apparatus for cooling which, with known use of a membrane filter, permits adequate electromagnetic shielding without the specified disadvantages of the prior art.

SUMMARY OF THE INVENTION

The apparatus according to the present invention for cooling an electrical module arranged in a housing has at least one membrane filter, arranged in an air inlet of the housing in each case, for a superficial filtering of at least dirt particles from inflowing cooling air for cooling the electrical module and also at least one cooling device for establishing an air flow in the housing and for discharging the filtered cooling air, heated up from flowing through or around the module, out of the housing from at least one air outlet. The membrane filter is characterized by having a netting of an electrically conductive material for electromagnetically shielding the electrical module.

The configuration of the apparatus according to the present invention has the advantage that an integration of the electrically conductive netting achieves the effect of electromagnetic shielding without an additional shielding arrangement having to be provided. Furthermore, the advantageous properties of the membrane filter are not restricted. For example, simple cleaning of the filter without prior detachment of a shielding grating is possible. As a result, the housing of the technical appliance can be provided in a very compact form.

The apparatus according to the present invention can be used in technical appliances with at least one electrical module, such as, for example, base stations of a mobile radio system or wireless subscriber line system (access network systems), traffic control devices, power supply devices or switch cabinets for a control system of industrial machines. In the same way, the apparatus according to the present invention can be used, for example, in smaller electrical appliances, such as a portable or stationary home computer, or in electrical measuring instruments.

According to a first embodiment of the present invention, the membrane filter additionally separates out liquids at the surface, whereby use of the technical appliance is also possible outside enclosed spaces or under adverse ambient conditions.

According to a second embodiment, the membrane filter is provided in the form of a fine-pored membrane applied to a backing material. This configuration of the membrane filter advantageously permits individual adaptability of the backing material and/or the membrane to special conditions of use of the technical appliance. For example, a filter resistant to chemical substances, such as acids, can be used for technical appliances used in production.

According to a third embodiment, based on the second embodiment, the electrically conductive netting is woven into the backing material of the membrane filter. As a result, a firm bonding of the netting to the backing material is advantageously achieved, one of the effects being, for example, that the stability of the membrane filter is increased.

As an alternative to the third embodiment, the electrically conductive netting is applied to the backing material. This embodiment advantageously permits simple production of the membrane filter, the electrically conductive netting being applied to the membrane filter, for example, in an additional production step. A bonding between the netting and the backing material can be achieved, for example, by an adhesive bonding technique.

According to a further alternative embodiment, the electrically conductive netting is provided in the form of backing material for the membrane. By this embodiment, the electromagnetic shielding is advantageously integrated directly into the membrane filter, as a result of which there are no further working steps in the production of the membrane filter.

According to further alternative embodiments, the membrane may be made from a PTFE material known as Teflon or from an electrically conductive material. The PTFE material is already widely used, for example for water-impermeable items of clothing, and, based on its properties, can be flexibly adapted to a wide variety of requirements with regard to the pore size. If the membrane is produced from an electrically conductive material that has, for example, the same or comparable properties, it is advantageously possible to dispense with the additional electrically conductive netting.

According to a further embodiment, the electrically conductive material may be provided in the form of a metal, plastic or ceramic material. Plastic and ceramic materials, in particular, have advantageous properties in comparison with known metal materials; for example, with regard to the resistance to environmental influences, strength and processability.

According to a further embodiment of the present invention, the electrically conductive netting is electrically connected to the housing, the latter likewise being made at least partially from an electrically conductive material. Electrically conductive netting may be understood here according to the present invention as meaning an additional netting; a netting used as a backing material or a membrane of electrically conductive material. The connection to the housing brings about a grounding of the membrane filter, which alternatively also may be achieved via a separate grounded electrical connection.

According to a further configuration of the present invention, the effective surface area of the membrane filter is enlarged by a periodic folding, as a result of which clogging of the filter is advantageously reduced and the maintenance intervals are increased.

Furthermore, a membrane filter according to the present invention is advantageously additionally arranged at the air outlet of the housing. This configuration permits, for example, a reversal of the cooling air flow in the housing, in order to free the membrane filter at the air inlet of dirt particles, without dirt particles or liquids at the same time being able to pass through the air outlet into the housing.

According to a further embodiment, the cooling device includes a fan impeller driven by a motor. In this case, the motor speed, and consequently the throughput of the cooling air in the housing, for example, can be controlled in dependence on the temperature in the housing and/or on the temperature of the ambient atmosphere, with the advantageous result that a constant operating temperature of the electrical module and a constant temperature inside the housing are ensured, and consequently the service life of the electrical module is advantageously prolonged. Furthermore, the speed of the cooling device can be controlled, for example, in such a way that the admissible limiting temperatures of the electrical module are not quite exceeded. Consequently, the noise emission of the arrangement is minimized by the lowest possible speed of the cooling device.

The apparatus according to the present invention is suitable, in particular, for use in technical appliances, such as base stations or similar outdoor installations of a mobile radio system or wireless subscriber line system, and also in traffic control devices, radio relay devices, etc.

Additional features and advantages of the present invention are described in, and will be apparent from, the following Detailed Description of the Invention and the Figures.

BRIEF DESCRIPTION OF THE FIGURES

FIG. 2 shows the apparatus according to the present invention in a side view.

DETAILED DESCRIPTION OF THE INVENTION

Figure 1:
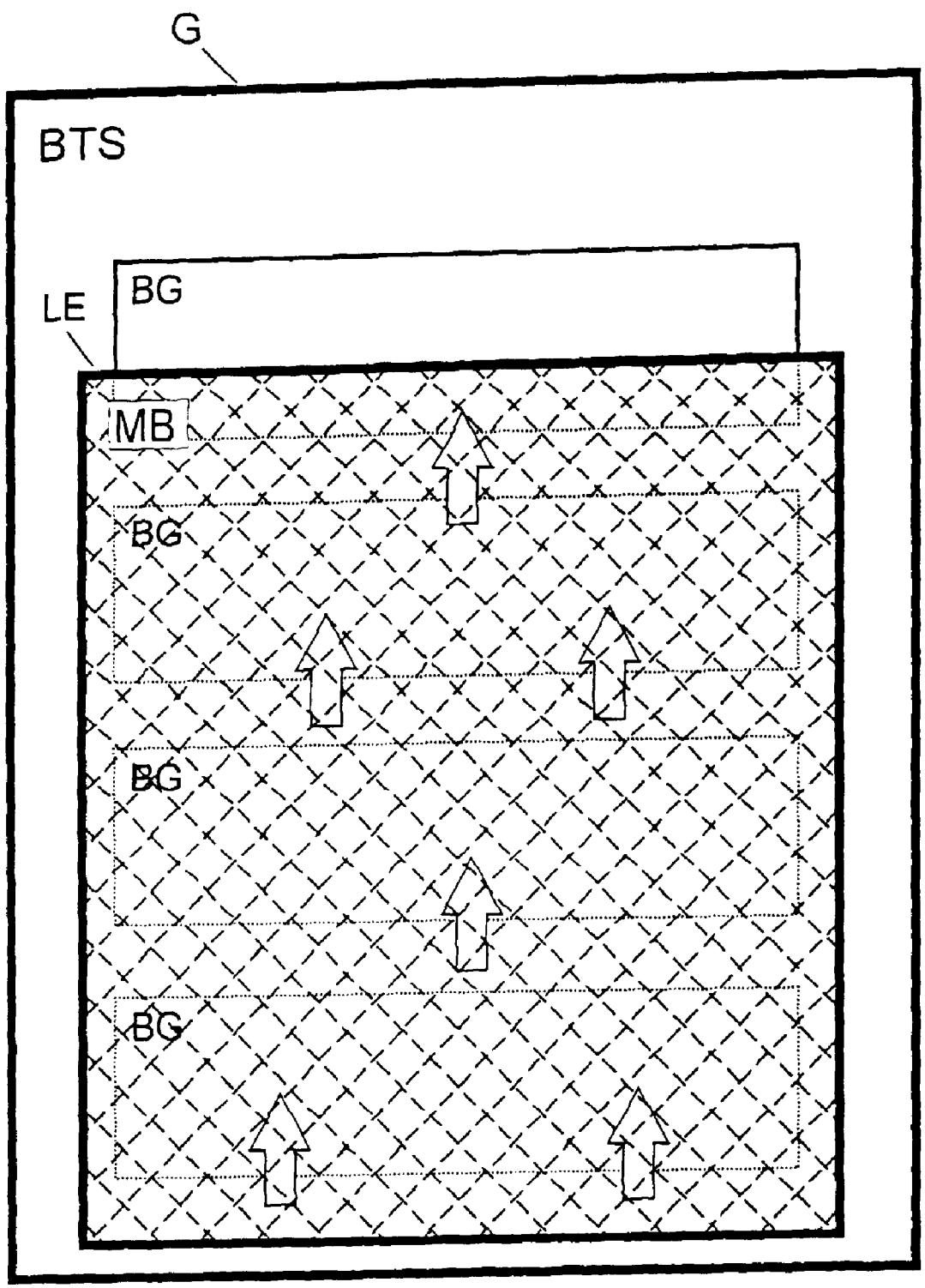
FIG. 1 shows a base station of a mobile radio system with the apparatus according to the present invention for cooling electrical modules, in a front view.

A prior-art technical appliance, such as, for example, a base station BTS of a mobile radio system or wireless subscriber line system, according to FIG. 1, includes a number of electrical modules BG. During the operation of the electrical appliance, the lost power of the individual electrical modules BG results in a heating-up effect, giving rise to the necessity for cooling in order not to exceed an admissible operating temperature of the modules.

The housing G, represented in a front view, of the electrical appliance has on the end face an air inlet LE with a membrane filter MB. The overall dimensions of the air inlet LE are set, for example, in such a way that cooling air flowing in through the membrane filter MB from the ambient atmosphere of the technical appliance can flow through the electrical modules BG in each case from below and, if appropriate, from the front. Consequently, it can bring about a cooling-down of the modules. The active surface area of the membrane filter MB, which may be larger than the air inlet LE, for example due to a fold formation, is dimensioned such that the pressure drop of the inflowing cooling air can be compensated by a cooling device, or an adequate amount of cooling air still can flow in despite a partial clogging of the membrane filter MB by dirt particles or liquid.

FIG. 2 presents the described technical appliance in a side view in order to illustrate, in more detail, the internal construction shown by way of example. On the left-hand side of the housing G, a frame R with the membrane filter MB is arranged in front of the air inlet LE. The additional frame R permits rapid removal of the membrane filter MB; for example, for maintenance and cleaning purposes or for replacement. At the same time, the frame R permits the described folding of the membrane filter MB. To restrict the overall dimensions of the technical appliance, the frame R also may be integrated into the housing G.

The membrane filter MB is designed in the form of a surface filter, which has the special advantageous property of separating out dirt particles and liquids from the ambient atmosphere already at the surface of the membrane, whereby, for example, sensitive electronic components or circuits in the modules BG are protected from environmental influences of this type. A membrane filter MB of this type is based, for example, on a membrane filter known by the designation Goretex, Sympatex, etc., for use in articles of clothing. The membrane of the filter includes a fine netting or a knitted fabric of fibers. A very small pore size prevents any ingress of dirt particles into the membrane and consequently clogging. Nevertheless, dirt particles can be deposited on the surface of the membrane, but can be removed in a simple way. In the same way, liquids cannot pass the membrane up to a specific pressure per unit area.

An example of a material used for the membrane is PTFE, also known by the name Teflon. The membrane is generally applied to a coarsely woven backing material, such as polyamide, in order to achieve high stability and resistance of the membrane filter MB.

A special design of the membrane filter MB allows protective regulations in accordance with the IP guidelines up to, for example, IP55 to be satisfied, thereby permitting use of the technical appliance outside enclosed spaces or under adverse ambient conditions, such as those which occur, for example, in industrial production. Special selection of the membrane filter material additionally allows individual adaptation to the actual ambient conditions, such as resistance to acids.

Known membrane filters MBR produced according to the prior art consist of materials described above which are permeable to electromagnetic waves. To satisfy EMC guidelines (EMC—Electromagnetic Compatibility), however, the housing G of the technical appliance must in the same way have an electromagnetic shielding in the region of the air inlet LE. This is generally achieved by a wire grating attached in front of the air inlet LE and electrically connected to the housing. According to the present invention, on the other hand, the electromagnetic shielding is achieved by a special configuration of the membrane filter MB, whereby, for example, the maintenance and cleaning of the membrane filter MB is simplified. The possible configurations are presented below in FIGS. 3a and 3b.

The cooling of the electrical modules BG by a direct flow of cooling air through the housing G has the advantage of a necessary temperature difference tending toward zero between the temperature of the ambient atmosphere or the temperature of the inflowing cooling air and the temperature inside the housing G, whereby the operation of the electrical modules BG is safeguarded even at a temperature of the ambient atmosphere of, for example, +70° C., which corresponds to the limiting temperature of the components reduced by the degree of internal heating-up.

A cooling device VE, which is arranged, for example, in the upper region of the rear housing wall, sucks in the air heated up as it flows through or around the electrical modules BG and discharges it to the ambient atmosphere through an air outlet LA. Used as cooling devices VE are, for example, one or more fans which produce an air flow. Cooling via natural convection is not adequate for reliable operation of the modules BG below the limiting temperature if a strong heating-up of the modules BG occurs due to a high internal lost power.

To control the temperature inside the housing G, the speed of the fan is automatically controlled. To acquire parameters for this control, temperature sensors which permanently determine the temperatures of the inflowing cooling air and the atmosphere inside the housing G may be provided; for example, in the region of the air inlet LE and at various points inside the housing G. In this automatic control, the throughput of the cooling air in the housing G is changed via the speed of the fan of the cooling device VE in order to obtain, for example, a constant temperature inside the housing G independently of the temperature of the ambient atmosphere. A constant operating temperature of the modules BG has positive effects; for example, on the service life of the electronic components and the high-performance circuits. In addition, constantly keeping the speed of the cooling device VE low, on condition that the limiting temperature of the components is not exceeded, makes it possible to minimize the noise emission of the technical appliance. Furthermore, the automatic control makes it possible to dispense with the operation of the cooling device VE initially during cold starting of the appliance, to heat up the modules BG quickly to the desired operating temperature, and to carry out further automatic control of the cooling device VE only once this operating temperature has been reached so as to maintain the operating temperature.

During maintenance of the technical appliance, it is possible, for example by a reversal of the direction of rotation or a change in the blade setting of the fan impeller of the cooling devices VE, for the air flow in the housing G to be reversed, whereby cooling air flows into the housing through the air outlet LA and is led out through the membrane filter MB. As this happens, dirt particles deposited on the surface of the membrane filter MB are dislodged, and a cleaning of the membrane filter MB is achieved. This cleaning operation also may be initiated, for example, by a permanent measuring process of the air throughput in dependence on the speed of the cooling arrangement VE, when it falls below a fixed value, the measured ratio indicating the degree of soiling of the membrane filter MB. In this case, a membrane filter MB is advantageously arranged in the air outlet LA, so that no dirt particles or liquid can get into the housing G even when the air flow is reversed.

Arranging the modules BG in such a way that they are spaced apart from one another makes it possible for a flow to take place through and/or around the modules BG. According to a known type of design, the modules BG include, for example, a module frame with electronic components and high-performance circuits located therein. The module frames are provided with ventilation slits, through which cooling air can reach the components and circuits. Within the scope of the present invention, modules BG are understood as also including all the electrical devices of a technical appliance. These are to include, for example, printed-circuit boards provided in a personal computer and also peripheral units, such as hard disks.

The arrangement of FIG. 2 has in the spaces between the individual modules BG and also below the lowermost and above the uppermost module BG air-directing devices which have the task of distributing cooling air flowing in through the membrane filter MB evenly over the base area of the respective module BG, so that a homogeneous flow through the entire module BG occurs. Furthermore, the air-directing devices may be used for the mutual electromagnetic shielding of the modules BG with regard to satisfying the EMC regulations.

Figure 3A:
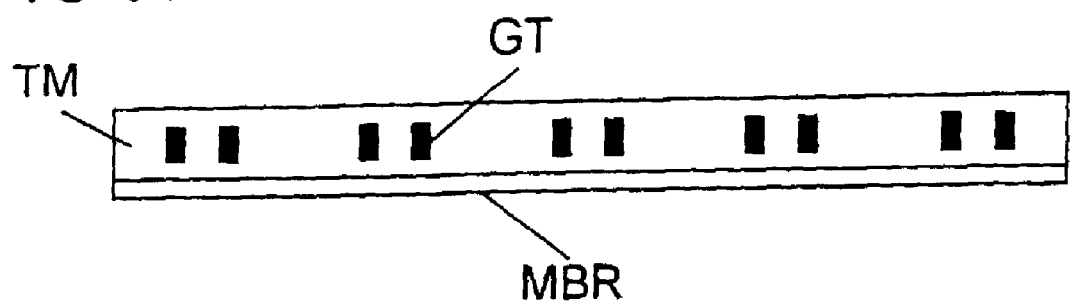
FIGS. 3a and 3b show two ways in which the membrane filter according to the present invention can be provided, by way of example.
Figure 3B:
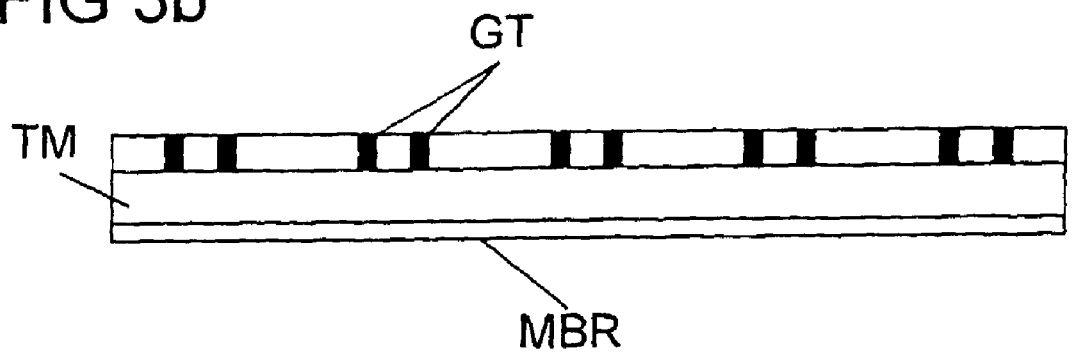

FIGS. 3a and 3b each show a membrane filter MB according to the present invention in a sectional representation. A prior-art membrane filter MB includes a coarsely woven and stable backing material TM with a membrane MBR of a fine knitted fabric or filament applied thereto. According to the present invention, as shown in FIG. 3a, a netting GT of an electrically conductive material is incorporated into the backing material TM. This conductive material may, for example, be woven in directly during the production of the backing material TM, and, in a way corresponding to FIGS. 1 and 4, produce a lattice-shaped structure referred to as Ripstock. The advantage of weaving-in is to be seen in the fact that the still very fine-pored surface prevents particles from becoming lodged on the netting and consequently clogging the membrane filter MB. A metal, plastic or ceramic is used as the electrically conductive material, it also being possible to take into consideration the use of all materials exhibiting the desired properties in the future. The electrically conductive netting GT is connected to a frame or grounded. This may take place by a connection of the netting GT to the housing, provided that the latter likewise consists at least partially of an electrically conductive material.

According to FIG. 3b, the electrically conductive netting GT is applied to the carrier material TM and physically connected to it. Further variants according to the present invention of the construction of the membrane filter MB, according to which the backing material TM or the membrane MBR itself consists of an electrically conductive material, are not represented in the figures. In these latter configurations, it is possible to dispense with an additional electrically conductive netting, thereby further simplifying the construction and production of the membrane filter MB.

Figure 4:
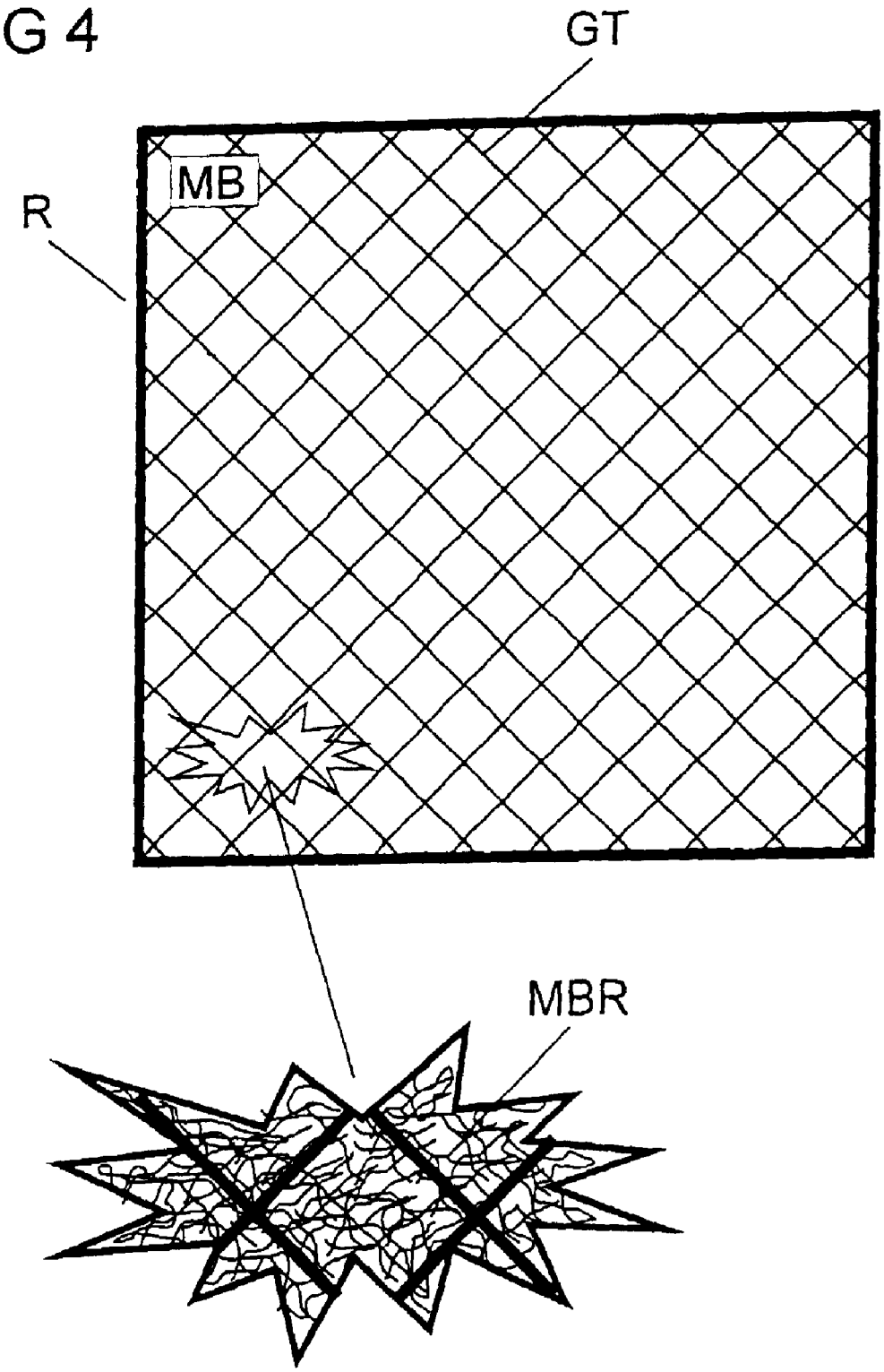
FIG. 4 shows a detailed representation of the membrane filter according to the present invention.

In FIG. 4, the membrane filter MB, arranged in a frame R, is shown with an electrically conductive netting GT. In an enlargement of a detail at the bottom, the structure of the membrane filter MB is presented in a plan view. The membrane MBR, including a knitted fabric of individual thin filaments and permitting a very small pore size, can be seen clearly. Arranged over the membrane MBR is the netting GT of electrically conductive material, with a relatively great distance between the individual members of the netting GT. The dimensioning of the netting takes place, for example, in such a way that, on the one hand, a smallest possible surface of the membrane filter MB is sealed by the netting GT and, on the other hand, adequate electromagnetic shielding and stability of the membrane filter MB are achieved. The structure of the electrically conductive netting GT indicated in FIGS. 1 and 4 is shown by way of example and can, within the scope of the present invention, also take the form of any of a large number of known further structures.

Although the present invention has been described with reference to specific embodiments, those of skill in the art will recognize that changes may be made thereto without departing from the spirit and scope of the invention as set forth in the hereafter appended claims.

What is claimed is:

1. An apparatus for cooling an electrical module, comprising:
   a housing, wherein the electrical module is positioned inside the housing;
   at least one membrane filter positioned in an air inlet of the housing, the membrane filter providing filtering of at least dirt particles from inflowing air for cooling the electrical module, the membrane filter being formed of a fine-pored membrane which is made of electrically conductive material for providing electromagnetic shielding of the electrical module, and being applied to a coarsely woven backing material; and
   at least one cooling device for establishing an airflow in the housing and for discharging filtered cooling air, which is heated up upon flowing through and around the electrical module, out of at least one air outlet of the housing.

2. An apparatus for cooling an electrical module as claimed in claim 1, wherein the membrane filter separates out liquids at a surface.

3. An apparatus for cooling an electrical module as claimed in claim 1, wherein an effective surface area of the membrane filter is enlarged by a periodic folding.

4. An apparatus for cooling an electrical module as claimed in claim 1, wherein the cooling device is a fan impeller driven by a motor.

5. An apparatus for cooling an electrical module as claimed in claim 1, wherein the apparatus is a base station of at least one of a mobile radio system and a wireless subscriber line system.

6. An apparatus for cooling an electrical module as claimed in claim 1, wherein the electrically conductive material is selected from the group consisting of metal, plastic and ceramic.

7. An apparatus for cooling an electrical module, comprising:
   a housing, wherein the electrical module is positioned inside the housing;
   at least one membrane filter positioned in an air inlet of the housing, the membrane filter providing filtering of at least dirt particles from inflowing air for cooling the electrical module, the membrane filter being formed of a fine-pored membrane which is applied to a backing material having a netting of an electrically conductive material woven thereinto for electromagnetic shielding of the electrical module; and
   at least one cooling device for establishing an airflow in the housing and for discharging filtered cooling air, which is heated up upon flowing through and around the electrical module, out of at least one air outlet of the housing.

8. An apparatus for cooling an electrical module as claimed in claim 7, wherein the fine-pored membrane is formed from a PTFE material.

9. An apparatus for cooling an electrical module as claimed in claim 7, wherein the electrically conductive netting is electrically connected to the housing, the housing being formed at least partially from an electrically conductive material.

10. An apparatus for cooling an electrical module as claimed in claim 7, further comprising:
    a further membrane filter with an electrically conductive netting positioned in an air outlet of the housing.

11. An apparatus for cooling an electrical module, comprising:
    a housing, wherein the electrical module is positioned inside the housing;
    at least one membrane filter positioned in an air inlet of the housing, the membrane filter providing filtering of at least dirt particles from inflowing air for cooling the electrical module, the membrane filter being formed of a fine-pored membrane which is applied to a backing material of electrically conductive netting for electromagnetic shielding of the electrical module; and
    at least one cooling device for establishing an airflow in the housing and for discharging filtered cooling air, which is heated up upon flowing through and around the electrical module, out of at least one air outlet of the housing.

* * * * *

UNITED STATES PATENT AND TRADEMARK OFFICE
CERTIFICATE OF CORRECTION

PATENT NO.     : 6,552,900 B1
DATED          : April 22, 2003
INVENTOR(S)    : Bruno Hoefer and Guido Reeck It is certified that error appears in the above-identified patent and that said Letters Patent is hereby corrected as shown below:

<u>Title page, Item [54] and Column 1, lines 1 and 2,</u>
Delete "DEVICE FOR COOLING AN ELECTRIC MODULE AND A TECHNICAL APPLIANCE", and insert
-- APPARATUS FOR COOLING AN ELECTRICAL MODULE -- therefor <u>Title page,</u>
Item [22], "PCT Filed:," delete "Apr. 10, 2000", and insert -- Apr. 7, 2000 -- therefor Signed and Sealed this Ninth Day of September, 2003

JAMES E. ROGAN
*Director of the United States Patent and Trademark Office*